(12) United States Patent
Byun

(10) Patent No.: US 9,501,373 B2
(45) Date of Patent: Nov. 22, 2016

(54) DATA STORAGE DEVICE AND OPERATING METHOD THEREOF

(71) Applicant: SK hynix Inc., Gyeonggi-do (KR)

(72) Inventor: Eu Joon Byun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 38 days.

(21) Appl. No.: 14/631,329

(22) Filed: Feb. 25, 2015

(65) Prior Publication Data

US 2016/0132406 A1    May 12, 2016

(30) Foreign Application Priority Data

Nov. 11, 2014  (KR) .................. 10-2014-0156107

(51) Int. Cl.
| | | |
|---|---|---|
| G06F 11/00 | (2006.01) | |
| G06F 11/20 | (2006.01) | |
| G06F 12/10 | (2016.01) | |
| G06F 11/07 | (2006.01) | |

(52) U.S. Cl.
CPC ......... *G06F 11/2017* (2013.01); *G06F 11/073* (2013.01); *G06F 11/0793* (2013.01); *G06F 12/109* (2013.01); *G06F 2212/657* (2013.01)

(58) Field of Classification Search
CPC .................. G06F 11/2017; G06F 12/109
See application file for complete search history.

(56) References Cited

U.S. PATENT DOCUMENTS

| | | | | |
|---|---|---|---|---|
| 5,572,466 A | * | 11/1996 | Sukegawa | G06F 3/0601 365/185.11 |
| 8,543,863 B2 | * | 9/2013 | Ipek | G06F 11/1008 365/200 |
| 2003/0051189 A1 | * | 3/2003 | Bobak | G06F 12/08 714/4.2 |
| 2007/0043975 A1 | * | 2/2007 | Varadarajan | G06F 11/1438 714/25 |
| 2007/0214310 A1 | * | 9/2007 | Ishimoto | G06F 12/0246 711/103 |
| 2010/0082888 A1 | * | 4/2010 | Mitsunaga | G06F 12/0246 711/103 |
| 2011/0283135 A1 | * | 11/2011 | Burger | G06F 11/073 714/6.1 |
| 2012/0151252 A1 | * | 6/2012 | Harris | G06F 11/141 714/6.13 |
| 2015/0234612 A1 | * | 8/2015 | Himelstein | G06F 3/0619 714/6.21 |

FOREIGN PATENT DOCUMENTS

| | | | |
|---|---|---|---|
| KR | 1020090106221 | | 10/2009 |
| KR | 1020090106221 A | * | 10/2009 |

* cited by examiner

*Primary Examiner* — Yolanda L Wilson
(74) *Attorney, Agent, or Firm* — IP & T Group LLP

(57) ABSTRACT

A data storage device includes memory devices including respective main regions and respective virtual regions, and a processor suitable for forming a super page by selecting main pages from the respective main regions, wherein when a main page of a main region in a memory device is a bad region, the processor forms a virtual super page by selecting a virtual page from a virtual region in the memory device instead of the main page.

14 Claims, 8 Drawing Sheets

DATA STORAGE DEVICE AND OPERATING METHOD THEREOF

CROSS-REFERENCES TO RELATED APPLICATION

The present application claims priority under 35 U.S.C.§119(a) to Korean application number 10-2014-0156107, filed on Nov. 11, 2014, in the Korean Intellectual Property Office, which is incorporated herein by reference in its entirety.

BACKGROUND

1. Technical Field

Various embodiments generally relate to a semiconductor apparatus and, more particularly, to maximizing the interleaving performance of a semiconductor memory apparatus.

2. Related Art

Semiconductor apparatuses, specifically, semiconductor memory apparatuses may be used to store data. Memory apparatuses may be generally divided into nonvolatile types and volatile types.

A nonvolatile memory apparatus may retain stored data even though power is cut off. The nonvolatile memory apparatus may include a flash memory apparatus such as a NAND flash and a NOR flash, an FeRAM (ferroelectric random access memory), a PCRAM (phase change random access memory), an MRAM (magnetoresistive random access memory) or a ReRAM (resistive random access memory).

A volatile memory apparatus loses stored data when power is cut off. Volatile memory apparatuses include SRAM (static random access memory) or DRAM (dynamic random access memory). Volatile memory apparatuses are generally used as buffer memory apparatuses, cache memory apparatuses, working memory apparatuses, or the like, in a data processing system, because they have a relatively high processing speed.

SUMMARY

Various embodiments are directed to a data storage device in which interleaving performance and space utilization efficiency are maximized.

In an embodiment, a data storage device may include memory devices including respective main regions and respective virtual regions, and a processor suitable for forming a super page by selecting main pages from the respective main regions, wherein when a main page of a main region in a memory device is a bad region, the processor forms a virtual super page by selecting a virtual page from a virtual region in the memory device instead of the main page.

In an embodiment, a data storage device may include memory devices including respective main regions and respective virtual regions, and a processor suitable for forming a super page or a virtual super page over the memory devices by referring to bad region information, and accessing the super page or the virtual super page in an interleaving scheme.

In an embodiment, a data storage device may include a nonvolatile memory device including a main region and a virtual region, and a processor suitable for accessing the main region or the virtual region by referring to bad region information, wherein the bad region information includes information on main pages which are processed as bad regions in the main region.

DETAILED DESCRIPTION

Figure 1:
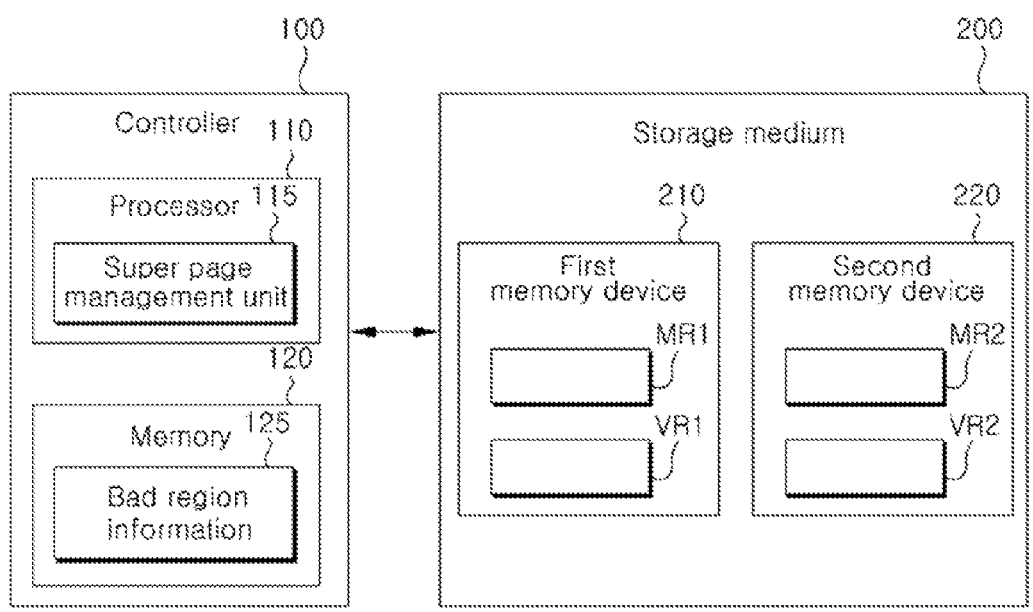
FIG. 1 is a block diagram illustrating an example of a data storage device in accordance with an embodiment.

Hereinafter, a data storage device and an operating method thereof will be described below with reference to the accompanying drawings through various embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and, in some instances, proportions may have been exaggerated in order to more clearly depict certain features of the invention. While particular terminology is used herein, it is to be appreciated that the terminology used herein is for the purpose of describing particular embodiments only and is not intended to limit the scope of the present invention.

FIG. 1 is a block diagram illustrating an example of a data storage device 10 in accordance with an embodiment.

The data storage device 10 may be configured to store the data provided from an external device (not shown) in response to a write request from the external device. Also, the data storage device 10 may be configured to provide stored data to the external device, in response to a read request from the external device.

The data storage device 10 may be configured by a personal computer memory card international association (PCMCIA) card, a compact flash (CF) card, a smart media card, a memory stick, a multimedia card in the form of an MMC, an eMMC, an RS-MMC and an MMC-micro, a secure digital card in the form of an SD, a mini-SD and a micro-SD, a universal flash storage (UFS), or a solid state drive.

The data storage device 10 may include a controller 100 and a storage medium 200.

The controller 100 may include a processor 110 and a memory 120.

The processor 110 may control the general operations of the data storage device 10. For example, the processor 110 may control the write operation or the read operation of the storage medium 200 in response to the write request or the read request from the external device. The processor 110 may drive a software program for controlling the operation of the data storage device 10, on the memory 120.

The processor 110 may separately manage bad regions which are determined not to ensure the reliability of stored data any more. The processor 110 may manage the bad regions on the basis of various region units. For example, the processor 110 may process bad pages as bad regions. The processor 110 may process pages which share a word line with a bad page, as bad regions. In a word line zone that includes a plurality of word lines adjacent to a word line corresponding to a bad page, the processor 110 may process all pages corresponding to the word line zone, as bad region.

The processor 110 may manage the addresses of the bad regions, as bad region information 125. The processor 110 may perform a control task by referring to the bad region information 125 such that data are not written in bad regions.

The processor 110 may access the super page or the virtual super page formed over first and second memory devices 210 and 220, in an interleaving scheme. The processor 110 may access a super page or a virtual super page to process at least one write request.

The processor 110 may include a super page management unit 115.

The super page management unit 115 may form a super page or a virtual super page over all the memory devices 210 and 220 such that the interleaving performance of the processor 110 may be maximized. The super page management unit 115 may form a super page or a virtual super page by referring to the bad region information 125.

In detail, the super page management unit 115 may form a super page by selecting only the main pages of main regions MR1 and MR2 in the respective first and second memory devices 210 and 220. The super page management unit 115 may form a virtual super page by selecting the main page of the main regions MR1 and MR2 and the virtual page of virtual regions VR1 and VR2 in the respective first and second memory devices 210 and 220. The super page management unit 115 may select the virtual page of the virtual regions VR1 and VR2 in the case where the super page management unit 115 cannot select the main page of the main regions MR1 and MR2.

The super page management unit 115 may not select the main page of the main regions MR1 and MR2 when the main page is managed as a bad region, that is, an access to the main page is prohibited. For example, the super page management unit 115 may not select a main page which is a bad page. For another example, the super page management unit 115 may not select a main page which shares a word line with a bad page. For still another example, the super page management unit 115 may not select a main page which corresponds to the same word line zone as a bad page.

For example, the super page management unit 115 may be realized by hardware such as a digital circuit, an analog circuit or a combination of digital and analog circuits. For another example, the super page management unit 115 may be realized by software such as firmware to be processed by the processor 110. For still another example, the super page management unit 115 may be realized by a combination of hardware and software.

The memory 120 may serve as the working memory, the buffer memory or the cache memory of the processor 110. The memory 120 may store software programs and various program data to be driven by the processor 110, buffer data to be transmitted between the external device and the storage medium 200, or temporarily store cache data.

The memory 120 may store the bad region information 125 to be referred to by the super page management unit 115. The bad region information 125 may include information on the bad regions of the storage medium 200. The bad region information 125 may be backed up in the storage medium 200.

The storage medium 200 may include the first and second memory devices 210 and 220. While it is illustrated as an example in FIG. 1 that the storage medium 200 includes 2 memory devices, it is to be noted that the number of memory devices to be included in the storage medium 200 is not specifically limited.

The respective first and second memory devices 210 and 220 may include the main regions MR1 and MR2 and the virtual regions VR1 and VR2. The first and second memory devices 210 and 220 may be nonvolatile memory devices.

Figure 2:
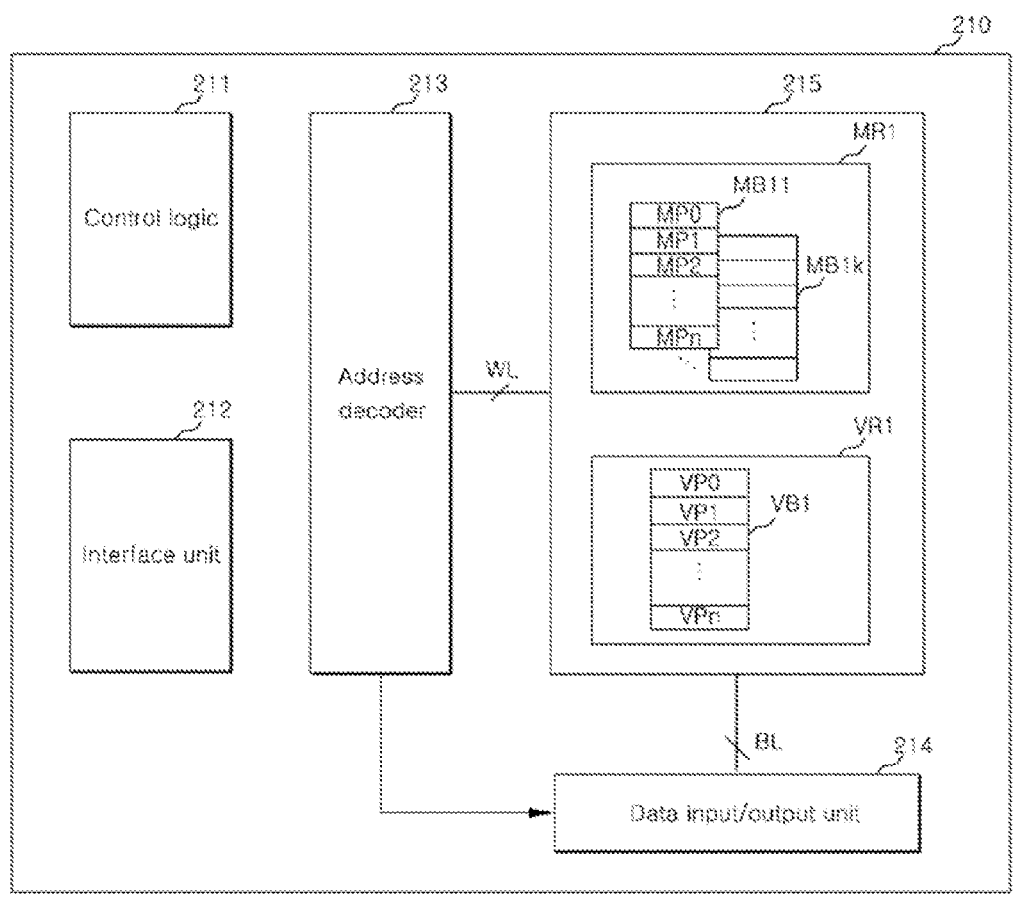
FIG. 2 is a block diagram illustrating an example of the first memory device shown in FIG. 1.

FIG. 2 is a block diagram illustrating an example of the first memory device 210 shown in FIG. 1. Since the first and second memory devices 210 and 220 shown in FIG. 1 may be configured in substantially the same way, the configuration of the first memory device 210 will be described below as an example.

The first memory device 210 may include a control logic 211, an interface unit 212, an address decoder 213, a data input/output unit 214, and a memory region 215.

The control logic 211 may control the general operations of the first memory device 210 such as a write operation, a read operation and an erase operation, in response to the commands provided from the controller 100.

The interface unit 212 may exchange various control signals including commands and addresses and data with the controller 100. The interface unit 212 may transmit the various control signals and data inputted thereto, to the internal units of the first memory device 210.

The address decoder 213 may decode row addresses and column addresses. The address decoder 213 may control word lines WL to be selectively driven according to the decoding results of the row addresses. The address decoder 213 may control the data input/output unit 214 such that bit lines BL are selectively driven according to the decoding results of the column addresses.

The data input/output unit 214 may transmit the data transmitted from the interface unit 212 to the memory region 215 through the bit lines BL. The data input/output unit 214 may transmit the data read through the bit lines BL from the memory region 215, to the interface unit 212.

The memory region 215 may be electrically coupled with the address decoder 213 through the word lines WL, and may be electrically coupled with the data input/output unit 214 through the bit lines BL. The memory region 215 may include a memory cell array of, for example, a three-dimensional structure. The memory region 215 may include a plurality of memory cells (not shown) which are respectively disposed at regions where the word lines WL and the bit lines BL cross each other. The memory cells may be distinguished from each other depending on the number of data bits stored therein.

For example, the memory cells may be distinguished as single level cells, each of which stores 1 bit, and multi-level cells, each of which stores at least 2 bits.

The memory region 215 may include the main region MR1 and the virtual region VR1.

The main region MR1 may include a plurality of main memory blocks MB11 to MB1$k$, Each of the main memory blocks MB11 to MB1$k$ may include a plurality of main pages. For example, the first main memory block MB11 may include a plurality of main pages MP0 to MPn. The main pages MP0 to MPn may be afforded with page numbers depending on offset values. The main pages MP0 to MPn may be accessed in the order of the page numbers.

The virtual region VR1 may include at least one virtual memory block VB1. While it is illustrated in FIG. 2 as an example that the virtual region VR1 includes the one virtual memory block. VB1, it is to be noted that the number of virtual memory blocks to be included in the virtual region VR1 is not specifically limited. The virtual memory block VB1 may include a plurality of virtual pages VP0 to VPn, The virtual pages VP0 to VPn may be afforded with page numbers depending on offset values. The virtual pages VP0 to VPn may be accessed in the order of the page numbers.

A memory block may be a unit for an erase operation performed on the memory region 215. That is, the erase operation may be performed on each memory block. A page may be a unit for a write operation or a read operation performed on the memory region 215. Memory blocks and pages may be afforded with corresponding addresses, and may be accessed based on the addresses. For example, a page may be accessed by driving a corresponding word line.

Figure 3:
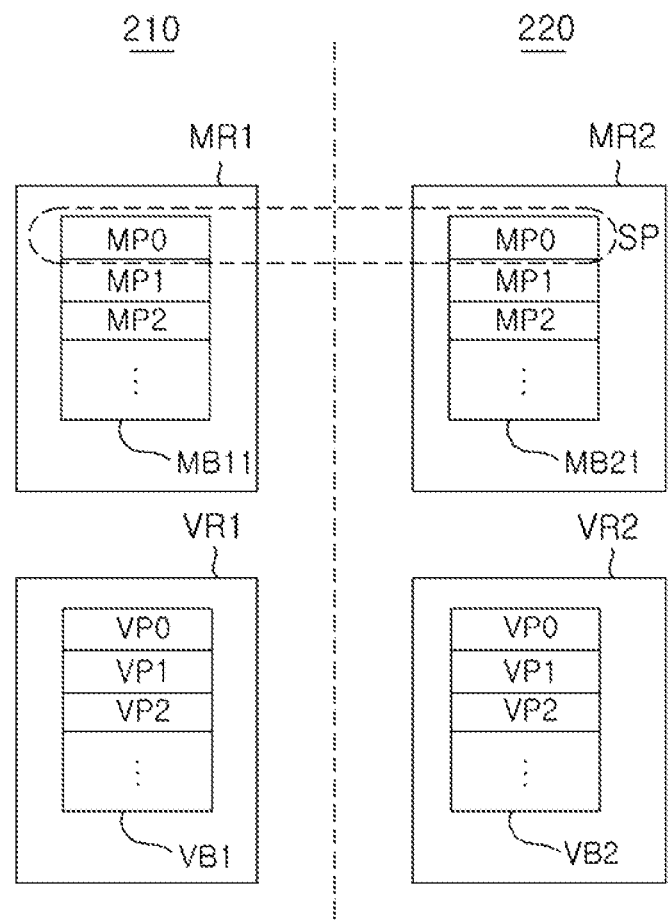
FIGS. 3 to 5 are diagrams illustrating examples of a super page and a virtual super page formed over first and second memory devices by the super page management unit shown in FIG. 1.
Figure 4:
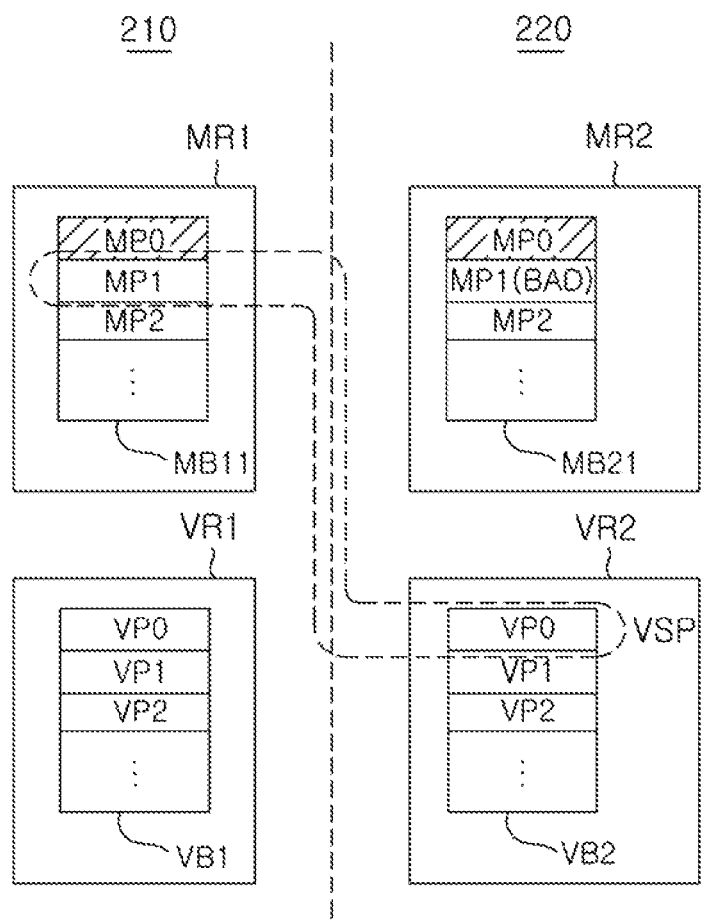
Figure 5:
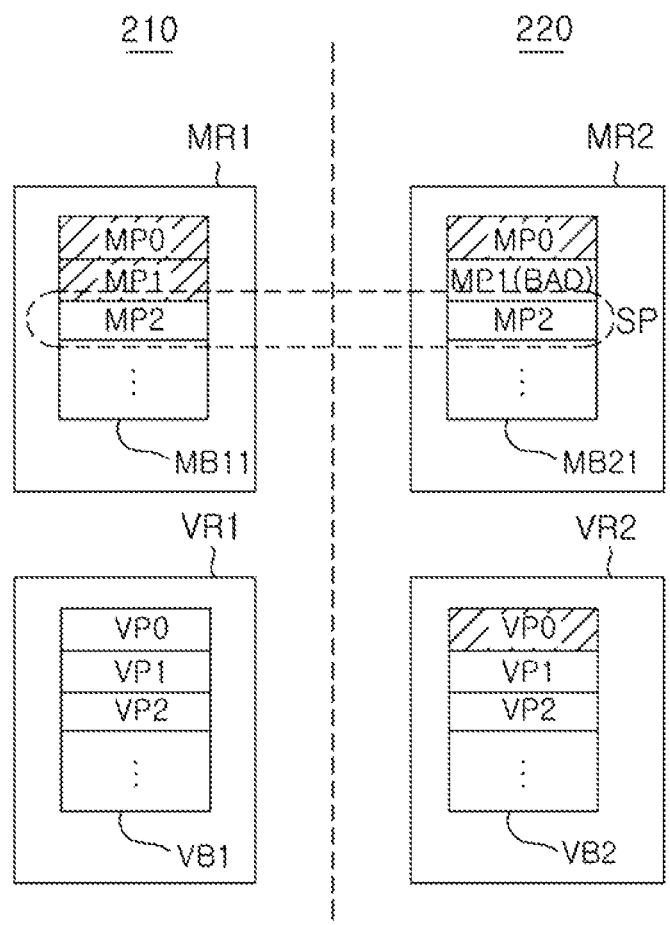

FIGS. 3 to 5 are diagrams illustrating examples of a super page SP and a virtual super page VSP formed over the first and second memory devices 210 and 220 by the super page management unit 115 shown in FIG. 1. Referring to FIGS. 3 to 5, there are shown the main regions MR1 and MR2 and the virtual regions VR1 and VR2 of the respective first and second memory devices 210 and 220. The main memory blocks MB11 and MB21 selected to store data in the respective main regions MR1 and MR2 are shown as an example.

Hereinbelow, a method for the super page management unit 115 to form a super page or a virtual super page will be described in detail with reference to FIGS. 3 to 5.

The super page management unit 115 may form a super page SP by selecting only the main pages of the main regions MR1 and MR2 in the respective first and second memory devices 210 and 220. The super page management unit 115 may form a virtual super page VSP by selecting the main page of the main regions MR1 and MR2 and the virtual page of the virtual regions VR1 and VR2 in the respective first and second memory devices 210 and 220. The super page management unit 115 may select the virtual page of the virtual regions VR1 and VR2 in the case where the super page management unit 115 cannot select the main page of the main regions MR1 and MR2. The super page management unit 115 may not select the main page of the main regions MR1 and MR2 when the main page is managed as a bad region. The super page management unit 115 may refer to the bad region information 125 stored in the memory 120, to check bad regions.

The super page management unit 115 may check whether a main page is a bad region, based on a reference offset value. For example, the super page management unit 115 may check whether a main page with a reference offset value is a bad region. For example, referring to FIG. 3 the super page management unit 115 may check whether the main pages MP0 with an offset value of 0 in the first and second memory devices 210 and 220 are bad regions, based on a reference offset value that is initially set to 0. In the case where it is checked that the main pages MP0 with the offset value of 0 are normal pages, the super page management unit 115 may form a super page SP by selecting and grouping the main pages MP0 with the offset value of 0.

A reference offset value may mean a reference value for checking a bad region and selecting a main page to be grouped. After a super page is formed and written, the reference offset value may be increased by the super page management unit 115 to allow a new super page to be formed. For example, if a super page which is formed with the reference offset value of 0 is written, the super page management unit 115 may increase the reference offset value to 1.

Referring to FIG. 4, it is illustrated as an example that the reference offset value is set to 1 after the operation described above with reference to FIG. 3.

In order to form a new super page or a virtual super page, the super page management unit 115 may check whether the main pages MP1 with the offset value of 1 in the first and second memory devices 210 and 220 are bad regions, based on the reference offset value set to 1. In the case where the main page MP1 with the offset value of 1 in the second memory device 220 is checked as a bad region, the super page management unit 115 may select the virtual page VP0 of the virtual region VR2 in the second memory device 220. The super page management unit 115 may form a virtual super page VSP by selecting and grouping the main page MP with the offset value 1 in the first memory device 210 and the virtual page VP0 in the second memory device 220.

The super page management unit 115 may increase the reference offset value to 2 when the virtual super page VSP is written.

Referring to FIG. 5, it is illustrated as an example that the reference offset value is set to 2 after the operation described above with reference to FIG. 4.

In order to form a new super page or a virtual super page, the super page management unit 115 may check whether the main pages MP2 with the offset value of 2 in the first and second memory devices 210 and 220 are bad regions, based on the reference offset value set to 2. In the case where it is checked that the main pages MP2 with the offset value of 2 are normal pages, the super page management unit 115 may form a super page SP by selecting and grouping the main pages MP2 with the offset value of 2.

Figure 6:
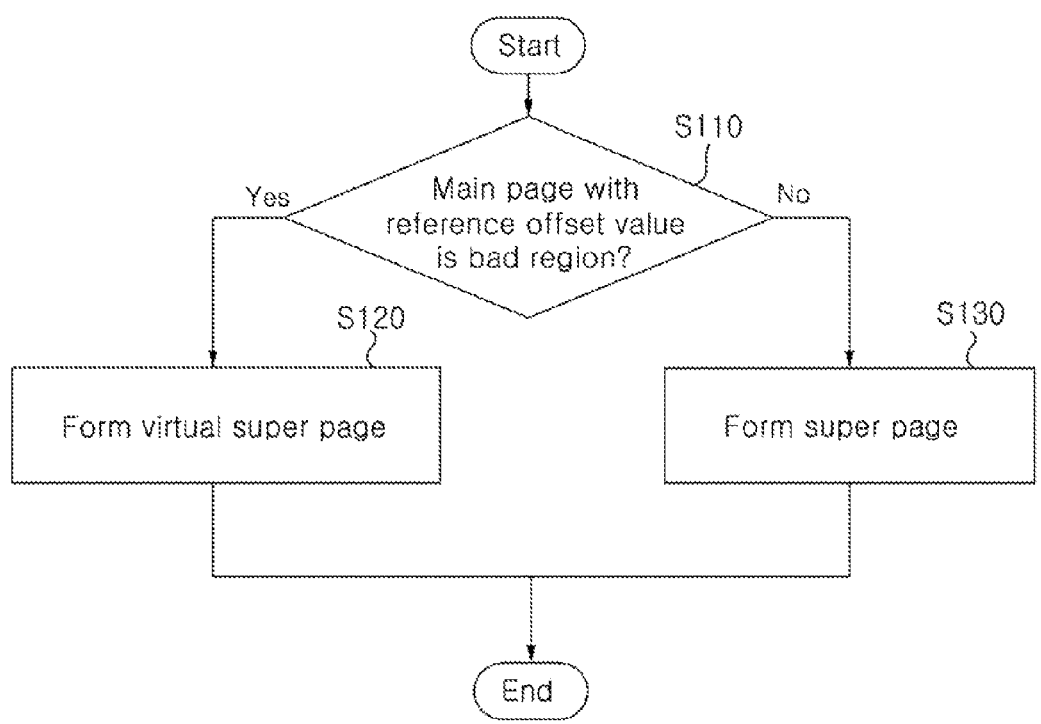
FIG. 6 a flow chart to assist in the explanation of an operating method of the super page management unit shown in FIG. 1.

FIG. 6 is a flow chart to assist in the explanation of an operating method of the super page management unit 115 shown in FIG. 1.

Hereinbelow, the operating method of the super page management unit 115 will be described in detail with reference to FIGS. 1 and 6.

At step S110, the super page management unit 115 may check whether main pages with a reference offset value in the respective first and second memory devices 210 and 220 are bad regions. The reference offset value may be a reference value for selecting a main page in each of the first, and second memory devices 210 and 220. The super page management unit 115 may refer to the bad region information 125 to check whether main pages with the reference offset value are bad regions. In the case where at least one main page with the reference offset value is checked as a bad region (Yes), the process may proceed to step S120. In the case where all main pages with the reference offset value are checked as normal pages (No), the process may proceed to step S130.

At the step S120, the super page management unit 115 may form a virtual super page. In detail, the super page management unit 115 may select a main page which is checked as a normal page, as it is, and may select a virtual page in a memory device which includes a main page checked as a bad region. The super page management unit 115 may form a virtual super page by grouping the selected main page and virtual page.

At the step S130, the super page management unit 115 may form a super page, The super page management unit 115 may form a super page by grouping the main pages which are checked as normal pages.

The super page management unit 115 may maximize the interleaving effect of the data storage device 10 by forming super pages or virtual super pages over all the memory devices 210 and 220 in the write operation. In the case where main pages of the main regions MR1 and MR2 in the respective first and second memory devices 210 and 220 are bad regions, the super page management unit 115 forms virtual super pages by selecting virtual pages from the virtual regions VR1 and VR2 separately included in the memory devices 210 and 220. Therefore, the data storage device 10 may efficiently use all the normal pages of the main regions MR1 and MR2.

The processor 110 may continuously form virtual super pages by reusing the virtual regions VR1 and VR2. For example, in the case where all the virtual pages of the virtual regions VR1 and VR2 are written, the processor 110 may perform a garbage collection operation for the virtual regions VR1 and VR2. The processor 110 may reuse the virtual regions VR1 and VR2 by copying the valid data stored in the virtual regions VR1 and VR2, to the main regions MR1 and MR2, and then erasing the virtual regions VR1 and VR2.

Figure 7:
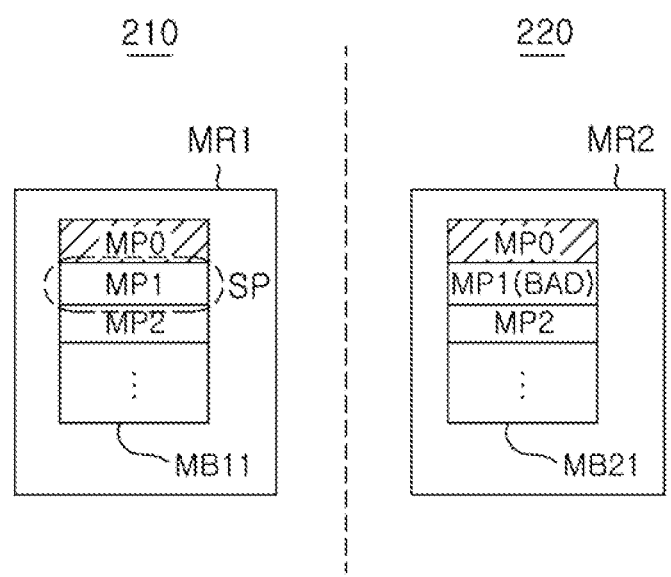
FIGS. 7 and 8 are diagrams to assist in the explanation of other methods for the super page management unit shown in FIG. 1 to form a super page.
Figure 8:
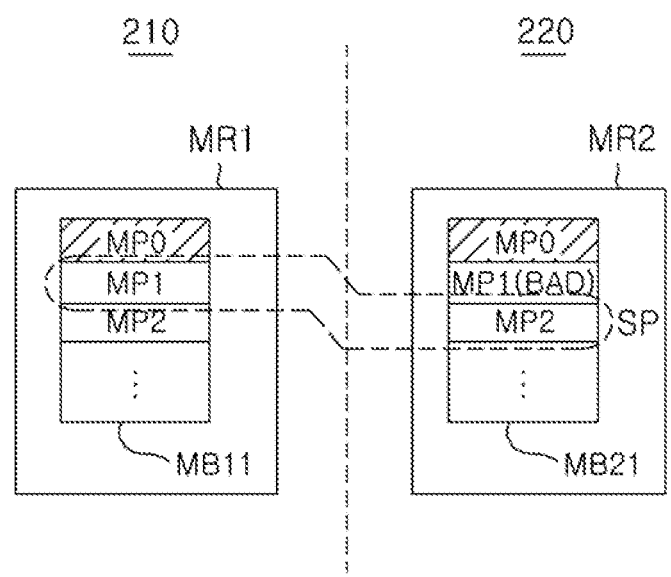

FIGS. 7 and 8 are diagrams to assist in the explanation of other methods for the super page management unit 115 shown in FIG. 1 to form a super page SP. In FIGS. 7 and 8, even though a main page with a reference offset value is checked as a bad region, the super page management unit 115 may form a super page by selecting only a main page or main pages, without forming a virtual super page using a virtual page as shown in the aforementioned embodiment.

In an example, in the case where a main page selected in a memory device is checked as a bad region by referring to the bad region information 125, the super page management unit 115 may form a super page over remaining memory devices excluding the memory device including the bad region. Referring to FIG. 7, in the case where the main page MP1 with the offset value of 1 in the second memory device 220 is a bad region, a super page SP may be formed by selecting only the main page MP1 with the offset value of 1 in the first memory device 210. However, in this method, although a burden of separately managing virtual regions is not imposed, it may be difficult to provide maximized interleaving performance.

In another example, in the case where a main page selected in a memory device is checked as a bad region by referring to the bad region information 125, the super page management unit 115 may form a super page by skipping the bad region and selecting a next main page in the corresponding memory device. Referring to FIG. 8, in the case where the main page MP1 with the offset value of 1 in the second memory device 220 is a bad region, a super page SP may be formed by selecting the main page MP2 with the offset value of 2 in the second memory device 220. However, in this method, although maximized interleaving effect may be provided, it may be difficult to provide maximized space utilization efficiency, since the total number of super pages to be formed may be limited resultantly.

As is apparent from the above descriptions, the data storage device according to the embodiment may provide maximized interleaving performance and space utilization efficiency.

While various embodiments have been described above, it will be understood to those skilled in the art that the embodiments described are examples only Accordingly, the data storage device and the operating method thereof described herein should not be, limited based on the described embodiments.

What is claimed is:

1. A data storage device comprising:
   memory devices including respective main regions and respective virtual regions; and
   a processor suitable for forming a super page by selecting main pages from the respective main regions,
   wherein when a main page of a main region in a memory device is a bad region, the processor forms a virtual super page by selecting a virtual page from a virtual region in the memory device instead of the main page.

2. The data storage device according to claim 1, wherein the processor forms the super page by selecting the main pages with a reference offset value from the respective main regions.

3. The data storage device according to claim 1, wherein the processor accesses the super page or the virtual super page to process at least one write request.

4. The data storage device according to claim 1, wherein the processor accesses the super page or the virtual super page in an interleaving scheme.

5. The data storage device according to claim 1, wherein the processor reuses the virtual regions to form the virtual super page, by copying valid data stored in the virtual regions, to the main regions.

6. A data storage device comprising:
   memory devices including respective main regions and respective virtual regions; and
   a processor suitable for forming a super page or a virtual super page over the memory devices by referring to bad region information, and accessing the super page or the virtual super page in an interleaving scheme.

7. The data storage device according to claim 6, wherein the bad region information includes information on main pages which are processed as bad regions in the respective main regions.

8. The data storage device according to claim 6, wherein the processor forms the super page by selecting a main page with a reference offset value in a main region, in each memory device.

9. The data storage device according to claim 8, wherein the processor forms the virtual super page by selecting a virtual page of a virtual region when the main page with the reference offset value is a bad region, in each memory device.

10. The data storage device according to claim 6, wherein the processor accesses the super page or the virtual super page to process at least one write request.

11. The data storage device according to claim 6, wherein the processor reuses the virtual regions to form the virtual super page, by copying valid data stored in the virtual regions to the respective main regions.

12. A data storage device comprising:
    a nonvolatile memory device including a main region and a virtual region; and
    a processor suitable for accessing the main region or the virtual region by referring to bad region information,
    wherein the bad region information includes information on main pages which are processed as bad regions in the main region,
    wherein, when a main page to be accessed based on an offset value is a bad region, the processor accesses a virtual page of the virtual region instead of the bad region.

13. The data storage device according to claim 12, wherein the processor accesses main pages of the main region based on the offset value.

14. The data storage device according to claim 12, wherein the processor reuses the virtual region by copying valid data stored in the virtual region, to the main region.

* * * * *